(12) United States Patent
Pickerd

(10) Patent No.: US 11,422,584 B2
(45) Date of Patent: Aug. 23, 2022

(54) JITTER INSERTION SYSTEM FOR WAVEFORM GENERATION

(71) Applicant: Tektronix, Inc., Beaverton, OR (US)

(72) Inventor: John J. Pickerd, Hillsboro, OR (US)

(73) Assignee: Tektronix, Inc., Beaverton, OR (US)

( * ) Notice: Subject to any disclaimer, the term of this patent is extended or adjusted under 35 U.S.C. 154(b) by 467 days.

(21) Appl. No.: 16/677,391

(22) Filed: Nov. 7, 2019

(65) Prior Publication Data
US 2020/0249712 A1 Aug. 6, 2020

Related U.S. Application Data

(60) Provisional application No. 62/801,028, filed on Feb. 4, 2019.

(51) Int. Cl.
*G06F 1/02* (2006.01)
*G06F 1/03* (2006.01)
*G01R 13/34* (2006.01)
*G01R 13/02* (2006.01)

(52) U.S. Cl.
CPC ............ *G06F 1/022* (2013.01); *G06F 1/03* (2013.01); *G01R 13/02* (2013.01); *G01R 13/345* (2013.01)

(58) Field of Classification Search
CPC .......... G06F 1/022; G06F 1/03; G01R 13/02; G01R 13/345; G01R 13/0218; H03M 1/665; H03M 11/04
USPC .......... 708/313, 315–316, 420–426; 376/226
See application file for complete search history.

(56) References Cited

U.S. PATENT DOCUMENTS

| 6,553,087 B1 * | 4/2003 | Alelyunas | H03H 17/0642 375/357 |
| 9,100,030 B1 | 8/2015 | Haisch | |
| 2012/0082242 A1 * | 4/2012 | Narroschke | H04N 19/86 375/E7.193 |
| 2013/0093493 A1 * | 4/2013 | Pickerd | G01R 13/0272 327/361 |

* cited by examiner

*Primary Examiner* — Tan V Mai
(74) *Attorney, Agent, or Firm* — Miller Nash LLP; Andrew J. Harrington

(57) ABSTRACT

A test and measurement instrument for generating an analog waveform, including an interpolator configured to receive a digital signal and output interpolated samples of the digital signal at a sample rate, a filter modulation controller configured to output first filter coefficients at a first time and second filter coefficients at a second time, a convolver configured to generate a convolved signal by convolving the interpolated samples of the digital signal and the first filter coefficients and convolving the interpolated samples of the digital signal and the second filter coefficients; and a digital-to-analog converter configured to convert the convolved signal to an analog signal based on a fixed, constant clock signal.

20 Claims, 4 Drawing Sheets

US 11,422,584 B2

JITTER INSERTION SYSTEM FOR WAVEFORM GENERATION

PRIORITY

This disclosure claims benefit of U.S. Provisional Application No. 62/801,028, titled "JITTER INSERTION SYSTEM FOR WAVEFORM GENERATION," filed on Feb. 4, 2019, which is incorporated herein by reference in its entirety.

FIELD OF THE INVENTION

This disclosure is directed to systems and methods related to test and measurement systems, and in particular, to a test and measurement system for inserting jitter into an interpolated digital signal prior to generating an analog signal.

BACKGROUND

Many test and measurement instruments, such as oscilloscopes, arbitrary waveform generators (AWG) or bit error rate testers (BERT) generate analog waveforms that can be transmitted to a device under test to provide information to a user regarding the device under test. It can often be beneficial to insert noise into the generated analog signal to test how well the device under test performs. For example, it may be beneficial to insert jitter into the generated analog waveform.

Generally, test and measurement instruments apply edge jitter to a generated analog waveform by varying a sample clock of a digital-to-analog converter (DAC). However, a disadvantage of this method is that for very high speed interleaved DAC systems, the calibration needed for each of the DACs is complex and costly to design and perform. That is, changing the clock rates of the interleaved DACs multiples the cost of calibration efforts significantly.

Rather than varying the sample clock of the DAC, some test and measurement instruments introduce jitter into a signal by highly over sampling the input digital signal in a digital signal processor (DSP), move the edges to a new location, and then apply a bandwidth limit filter and resample at the DAC sample rate. However, in a waveform generation system where it is desired that the DSP operate at the DAC sample rate of over 200 Giga-samples per second (GS/s), in real time, the oversampling method is not practical due to the speed of circuitry that would be needed for algorithms.

Embodiments of the disclosure address these and other deficiencies of the prior art.

BRIEF DESCRIPTION OF THE DRAWINGS

Aspects, features and advantages of embodiments of the present disclosure will become apparent from the following description of embodiments in reference to the appended drawings in which.

DESCRIPTION

Disclosed herein is a test and measurement instrument that can insert jitter into a waveform to be generated for, and transmitted to, a device under test, without adjusting the sample rate of one or more digital-to-analog converters or oversampling the digital signal in a DSP. That is, the test and measurement instrument can generate the jittered waveform while using a fixed, constant clock for the digital-to-analog converter.

Embodiments of the disclosure provide a means for introducing jitter into a digital signal by applying a filter, such as, but not limited to, an allpass filter, with coefficients that are changed as a function of time in the digital signal. In particular, and as discussed in more detail below, the digital signal can be filtered with an allpass filter, while a filter controller may identify when to switch in different coefficients with different group delays for the filter. Other criteria may be used for changing the filter, such that periodic long-term jitter may be introduced over multiple edges. However, embodiments of the disclosure are not limited to modulating the waveform edge transitions and other types of modulation algorithms may be deployed by controlling the filter coefficients of the filters.

Figure 1:
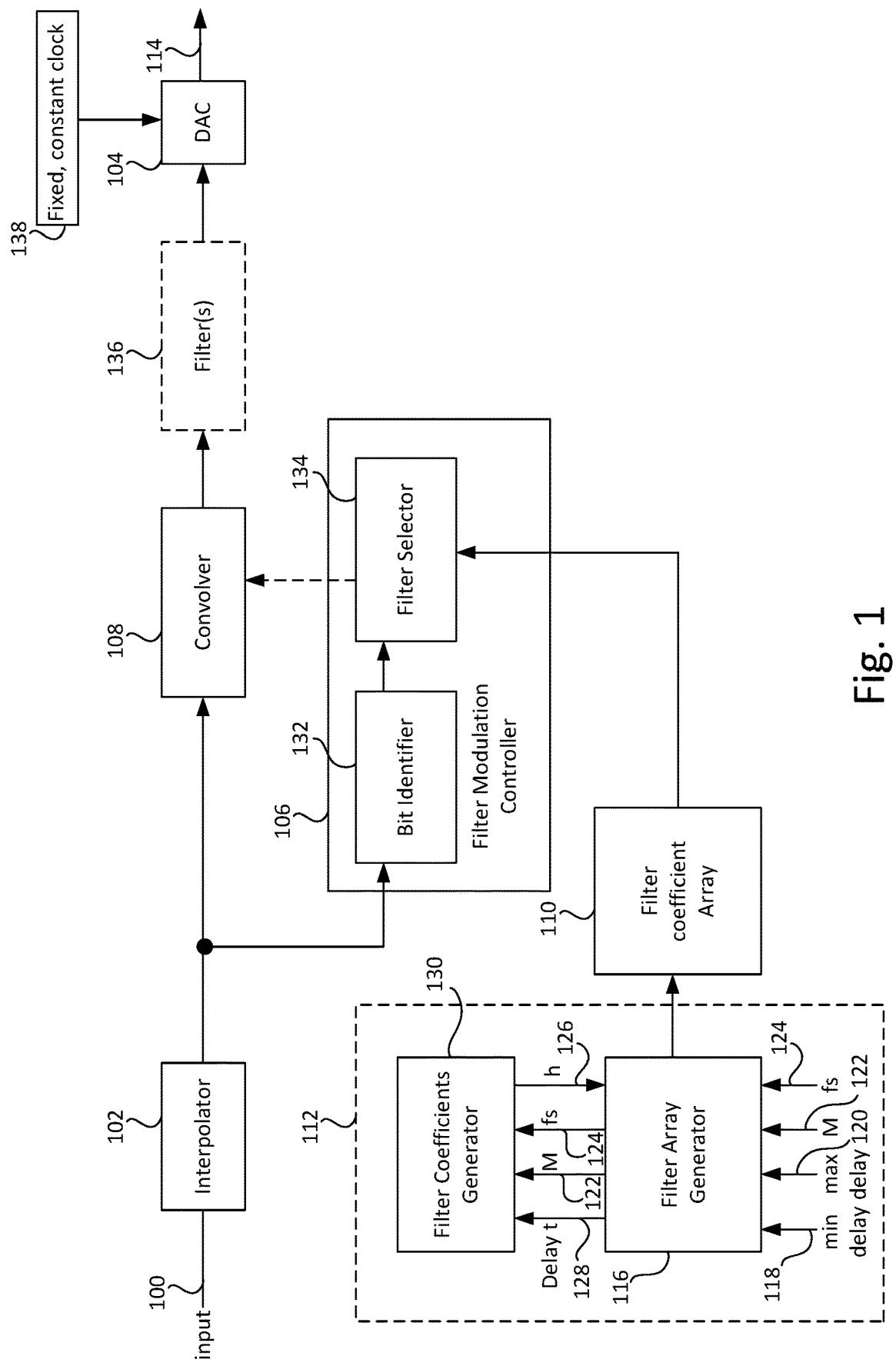
FIG. 1 is a block diagram of a portion of a test and measurement instrument for generating a waveform with jitter inserted according to some embodiments of the disclosure.

FIG. 1 illustrates an example of a portion of a test and measurement instrument according to some embodiments of the disclosure. As will be understood by one skilled in the art, the test and measurement instrument may include additional components not shown, such as, but not limited to, a processor, a memory, a user input, etc.

An input 100 is received at an interpolator 102. The input 100 may be received from a memory (not shown) on the test and measurement instrument, or may be supplied through other means, such as through a cable connection to another device or provided by a processor (not shown) on the test and measurement instrument. The input 100 may be any signal or samples representing a binary value, including, for example, a bit stream or a signal with a high value and a low value. In some embodiments, the bit stream may include a pseudo-random bit stream pattern (PRBS).

The interpolator 102 converts or interpolates the input 100 to samples at a sample rate of a digital-to-analog converter 104. The interpolated samples can be received at a filter modulation controller 106 and a convolver 108, each of which will be discussed in more detail below.

The filter modulation controller 106 receives a filter coefficient array 110 from a memory (not shown). The filter coefficient array 110 may be stored, for example, in a look-up table, so that the filter coefficient array may be easily accessed during waveform generation.

The filter coefficient array 110 is an array of filter coefficients of length M at a sample rate fs. The sample rate fs is the sample rate of the output waveform 114 from the DAC 104. Each set of coefficients h 126 in the array have a different delay. The filter coefficients are generated by the filter generator 112, which, as mentioned above, may be done prior to generating the output waveform 114 and stored in a look-up table in a memory of the test and measurement instrument. In some embodiments, each filter has the same flat frequency response over a range of direct current (DC)

to almost Nyquist. However, in other embodiments, the shape of the frequency response may also be varied over the range of filter indexes into the array.

The filter generator 112 may include a filter array generator 116 and a filter coefficients generator 130. The filter array generator 116 may be used to generate the filter coefficient array 110 using filter coefficients generated by the filter coefficients generator 130. The filters can vary in group delay, phase(f), and magnitude(f), where f is frequency. The filter array generator 116 receives a minimum delay 118, a maximum delay 120, a length M 122, and a sample rate fs 124 from a user input (not shown). User inputs may include a keyboard, mouse, trackball, touchscreen, and/or any other controls employable by a user to interact with a graphical user interface displayed on a display.

The filter array generator 116 can determine a delay t 128, and output the delay t 128, the length M 122, and the sample rate fs 124 to the filter coefficients generator 130. The filter coefficients generator 130 can generate coefficients with different group delays. For example, in some embodiments, allpass filter coefficients h 126 may be generated with a flat frequency response. For periodic jitter, the frequency of jitter modulation may be varied.

The filter coefficient array 110 may contain a set of a hundred or more filters with group delays covering some range of time over which the edges of a waveform will be jittered. In some embodiments, the range of time may be selected by a user and is only limited by the length of each filter and the sample rate fs 124. In other embodiments, the range of time is automatically determined by filter array generator 116 based on the filter lengths and the sample rate fs 124.

The filter modulation controller 106 can determine when to update filter coefficients in the convolver 108 to move each edge in the input waveform 100 by a randomized group delay amount. That is, the filter modulation controller 106 can control, as a function of time, when a new set of coefficients from the filter coefficient array 110 are transmitted to the convolver 108.

In FIG. 1, the filter modulation controller 106 may include a bit identifier 132 and a filter selector 134. The bit identifier 132 can determine when to update the coefficients in the convolver 108 based on the interpolated samples. For example, for random edge jitter, the bit identifier 132 can identify a time position at the center of each bit interval to determine bits prior to a transition in the input waveform 100. When a center of each bit interval prior to a transition is determined, a filter selector 134 can select filter coefficients to upload to the convolver 108.

The filter selector 134 selects which filter coefficients from the filter coefficient array 110 to transmit to the convolver 108. The filter selector 134, in some embodiments, may use a random number generator to select which filter coefficients to use from the filter coefficient array 110. This can randomize the group delay to be updated to the convolver 108 to prevent discontinuity on the edges which are to be jittered over time.

For periodic jitter, the bit identifier 132 may determine when to update the filter coefficients in the convolver 108, such that the group delay as a function of time is a sine wave, ramp, triangle, or any other shape as a function of time. The filter selector 134 may then select which filter coefficients from the filter coefficient array 110 to transmit to the convolver 108.

The convolver 108 uses the filter coefficients to convolve the interpolated waveform samples and introduce jitter into the interpolated waveform samples. The convolver 108 introduces the jitter at a point in the system when the edges of the input waveform 100 are only shaped from ideal to the shape resulting from the interpolator 102. Therefore, the edges are distinct and can be shifted by switching the filter group delays.

In some embodiments, such as high-speed parallel pipelined systems, the convolver 108 may have multiple finite impulse response (FIR) filters, so that one filter can be computing the convolution to obtain one output sample at the same time another filter is having its coefficients updated and made ready for computing and outputting a following waveform sample.

After the jitter has been inserted into the waveform samples, the waveform samples may be further filtered through one or more filters 136. Typically, test and measurement instruments may have one or more other waveform shaping filters 136 applied prior to generating the analog signal 114. These filters may include, for example, temperature compensation filters, bandwidth enhance filters to correct for a hardware response, simulation filters to emulate channels, continuous time linear equalization filters, or other generic filters such as to change bandwidth. These filters can remain fixed as a function of time when applied to a waveform.

Generally, and as illustrated in FIG. 1, these filters 134 may be applied after the jitter modulation through convolver 108 since the filter modulation controller 106 may function more accurately on the interpolated waveform. That is, the filter modulation controller 106 may more accurately identify the appropriate times to update the filter coefficients in the convolver 108 on the interpolated waveform, rather than a filtered waveform. Further, applying the jitter through convolver 108 prior to the filters 134 may be help minimize amplitude discontinuities due to the phase shifts by switching the filter coefficients h 126 on areas where the derivative of the waveform is zero.

However, embodiments of the disclosure are not limited to applying the one or more filters 136 after the jitter has been introduced into the interpolated waveform. In some embodiments, the one or more filters 136 may filter the waveform prior to the convolver 108 and/or one or more filters 136 may be applied before and after the convolver 108.

The output from either the convolver 108 or the filters 136 is input into the DAC 104 to generate the analog signal 114 from the waveform samples. The DAC 104 receives a fixed, constant clock signal 138 which may make the DAC 104 easier to calibrate during manufacturing. In some embodiments, the DAC 104 may be implemented by using multiple interleaved DACs, or other topologies for combining outputs from multiple DACs to reconstruct an output waveform.

Embodiments of the disclosure are not limited to predetermining and storing the filter coefficients array 110 in a look-up table. Rather, in some embodiments, the filter coefficient arrays may be generated in real-time, as illustrated in FIG. 2.

Figure 2:
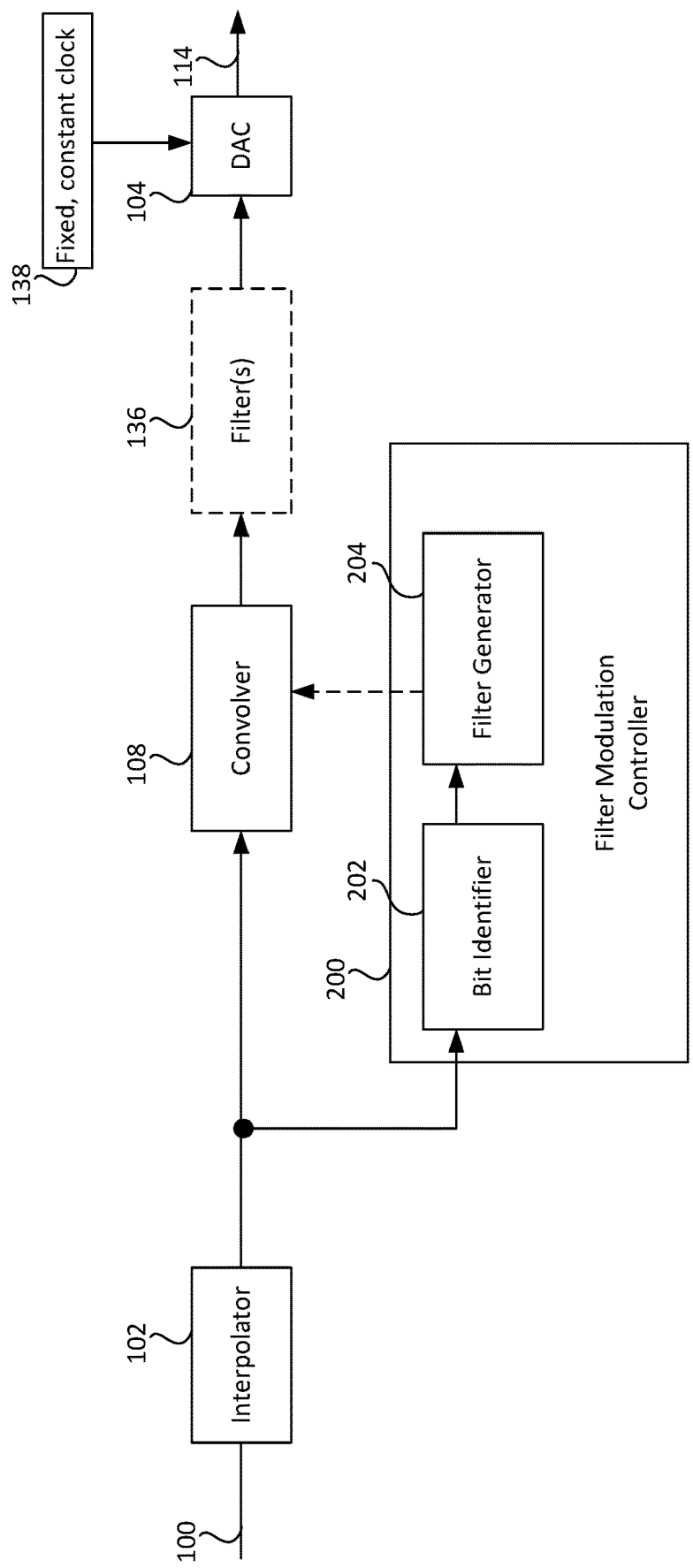
FIG. 2 is a block diagram of a portion of a test and measurement instrument for generating a waveform with jitter inserted according to other embodiments of the disclosure.

In FIG. 2, the input waveform 100, the interpolator 102, the convolver 108, the filters 136, the DAC 104, the fixed, constant clock 138, and the output waveform 114 operate in a similar manner to those discussed above with respect to FIG. 1. Accordingly, these components are given the same reference numbers and will not be discussed in further detail with respect to FIG. 2.

In FIG. 2, a filter modulation controller 200 can generate the filter coefficients in real-time as a function of time, or as a function of other criteria, including, but not limited to, logic decisions based on waveform parameters or based on external parameters. Similar to filter modulation controller 106, filter modulation controller 200 includes a bit identifier 202 to identify a point in the input waveform 100 for loading new coefficients into the convolver 108.

The filter generator 204 can generate filters based on a jitter or other modulation algorithm, and then the filter is stored in the convolver 108 at a time identified by the bit identifier 202. This allows the filter generator 204 to be generating the next set of filter coefficients while the convolver 108 is convolving the interpolated waveform samples based on the previously loaded coefficients. The filter generator 204 can then begin transmitting or updating the coefficients in the convolver 108 based on an output from the bit identifier 202.

In some embodiments, the filter generators 112 and 204 of FIGS. 1 and 2 may generate allpass filters using a filter length M, sample rate fs, and a group delay t in units of seconds. As mentioned above, the filter coefficients can be returned in a vector h 126. When using the allpass filters, the filter generators 112 and 204 may first determine the vector h 126 in the frequency domain, along with its complex conjugate side in the frequency domain. The vector h 126 in the frequency domain may then be assigned to be zero phase at all frequencies and to have a magnitude of 1.0 at all frequencies, except for Nyquist where it is set to zero. Then, the vector h 126 in the frequency domain may be converted to the time-domain using an inverse Fast Fourier transform.

A number of vectors h 126 can be determined to generate the filter coefficient array in the filter array generator 116 or by the filter generator 204. An array can be generated that has filters that range in delay over a time range, which can be set by a user.

As mentioned above, bit identifiers 132 and 202 can identify when the filter modulation controllers 106 and 200 transmit or update the new filter coefficients into the convolver 108. In some embodiments, this may be done by determining a first sample past a center of a bit interval. When the center is found, a new set of filter coefficients can be loaded into the convolver 108, which can use the new coefficients to compute the new output sample at this index.

A current coefficient filter set in the convolver 108 will be used to compute each succeeding output sample until it receives new coefficient filters from the filter modulation controllers 106 and 200. The filter modulation controllers 106 and 200 may transmit the new coefficient filters at the first sample after a middle of a next bit interval. At this point, the filter modulation controllers 106 and 200 will load a new set of filter coefficients to the convolver 108.

When inserting random edge jitter, the filter coefficients in the convolver 108 are only updated by the filter modulation controller 106 and 200 in bit intervals which have an edge transition at the end of the interval. Otherwise, the filter coefficients are not changed. This results in moving each edge randomly in time, either positively or negatively, with respect to the original edge transition.

Figure 3:
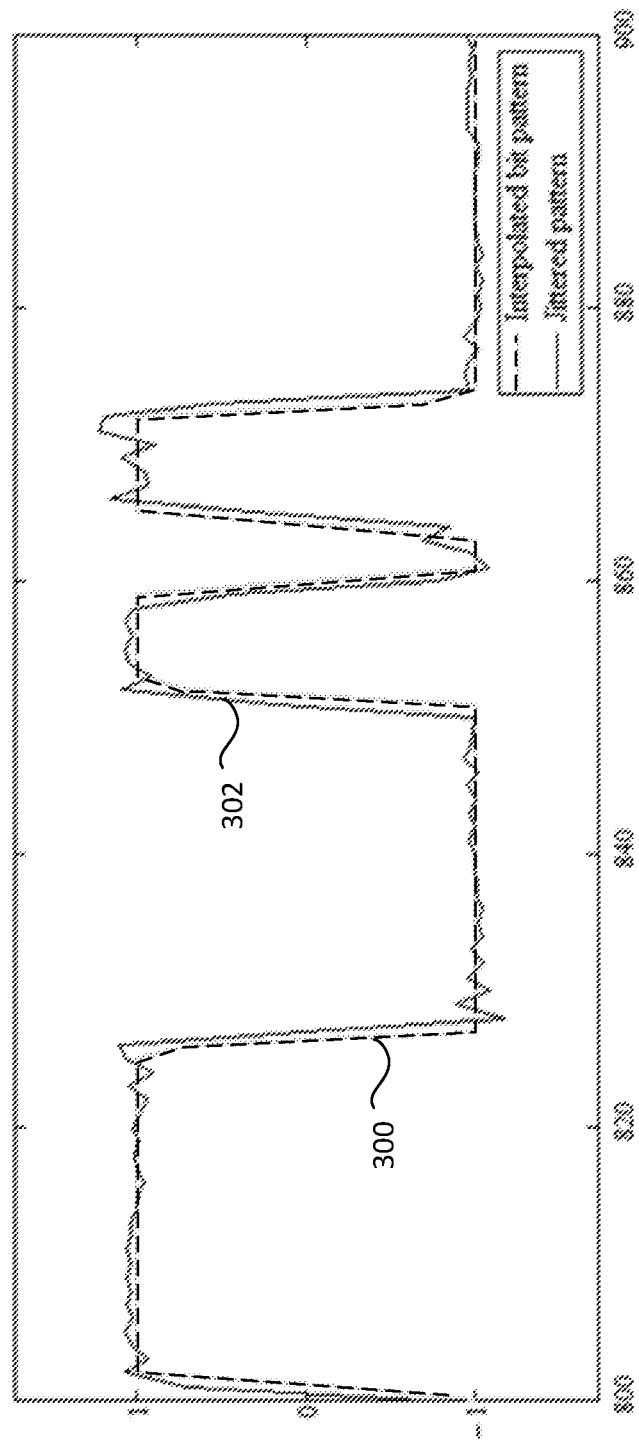
FIG. 3 is a comparison of an interpolated waveform and a waveform with jitter inserted according to some embodiments of the disclosure.

FIG. 3 illustrates an example of an ideal interpolated waveform versus a jittered waveform, prior to being converted to an analog waveform. Waveform 300 illustrates a linearly interpolated bit stream at a rate of 21 GS/s with a baud rate of 5 GBd. Waveform 302 is the output waveform from the convolver 108 with the jitter applied. As can be seen in FIG. 3, the edges in waveform 302 are moved by different amounts of delay in different directions with respect to the original edges.

Figure 4:
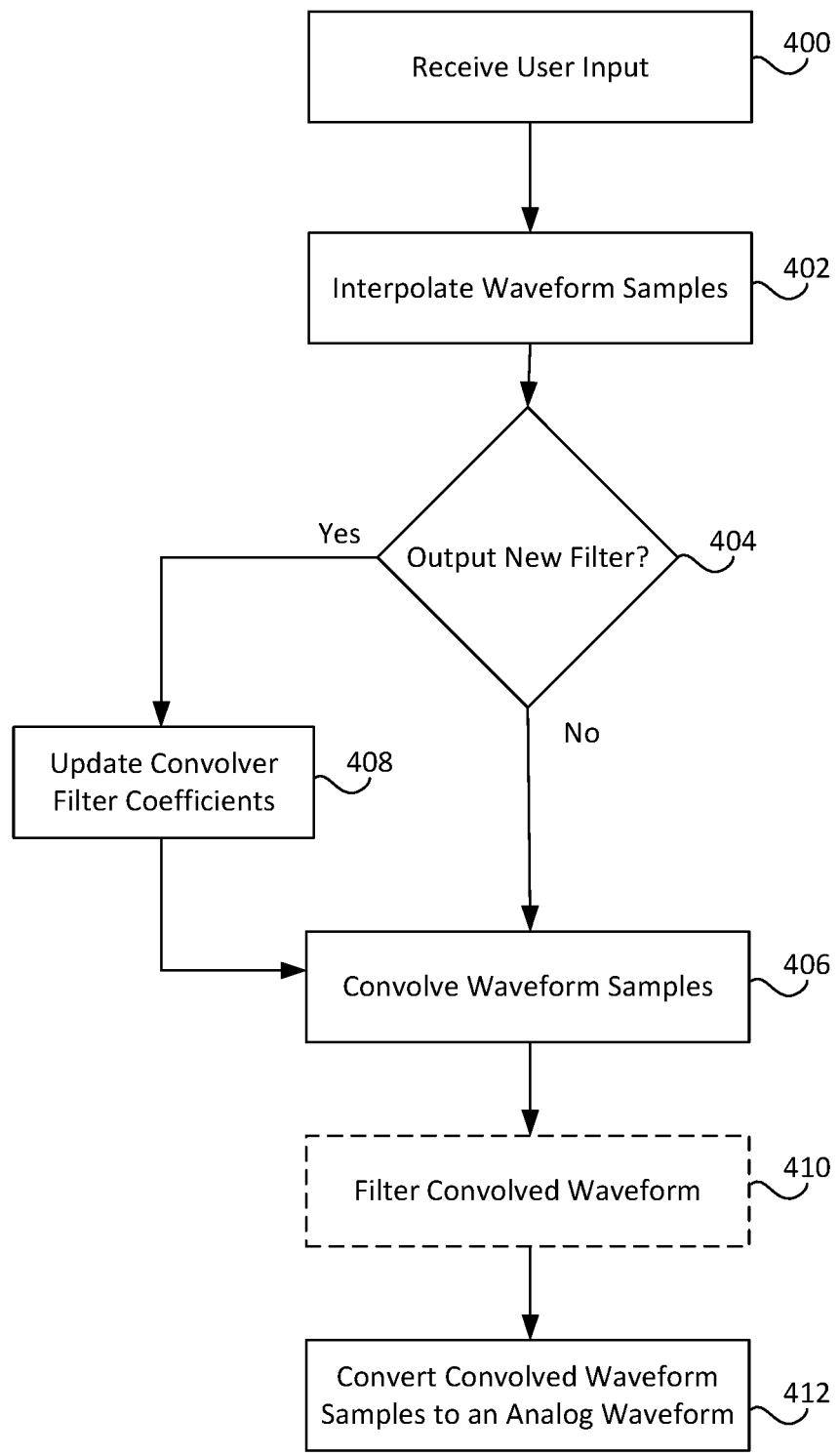
FIG. 4 is a flow chart illustrating a method for generating a jittered waveform according to embodiments of the disclosure.

FIG. 4 illustrates a method for generating an analog waveform with jitter according to embodiments of the disclosure.

Initially, in operation 400, a user input may be received to specify the type of jitter to be inserted into the ideal waveform, including, but not limited to, random edge jitter, periodic jitter, and time varying intersymbol interference. A user may also input the various parameters associated with each of these types of jitter or modulation that are chosen. The user may also set the parameters for the input waveform 100.

In operation 402, the input waveform 100 is interpolated to samples at the sample rate of the DAC 104, as discussed above. Based on the interpolated samples, the filter modulation controller 106 or 200 can determine if new filter coefficients need to be saved in the convolver 108 in operation 404. If no new filters need to be saved, then the interpolated samples are convolved in the convolver 108 with the current filter settings in the convolver 108 in operation 406.

If new filters are to be saved, then the convolver 108 filters are updated with new coefficients in operation 408, prior to the interpolated samples being convolved in operation 406. As discussed extensively above, the filter coefficients can be generated ahead of time and saved in a memory or may be generated in real-time.

As also mentioned above, the convolved signal may then be optionally filtered further in operation 410. Although not shown in FIG. 4, in some embodiments, operation 410 of filtering is performed prior to operation 406 in some embodiments. Finally, in operation 412, the convolved and optionally filtered signal is converted to an analog signal by DAC 104 based on a fixed, constant clock signal 138. This can allow for jitter to be introduced into the generated waveform without the costs and complexities of modifying the clock of the DAC 104 to introduce the jitter.

Aspects of the disclosure may operate on particularly created hardware, firmware, digital signal processors, or on a specially programmed computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a computer readable storage medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or computer-readable storage media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

EXAMPLES

Illustrative examples of the technologies disclosed herein are provided below. An embodiment of the technologies may include any one or more, and any combination of, the examples described below.

Example 1 is a test and measurement instrument for generating an analog waveform, comprising an interpolator configured to receive a digital signal and output interpolated samples of the digital signal at a sample rate; a filter modulation controller configured to output first filter coefficients at a first time and second filter coefficients at a second time; a convolver configured to generate a convolved signal by convolving the interpolated samples of the digital signal and the first filter coefficients and convolving the interpolated samples of the digital signal and the second filter coefficients; and a digital-to-analog converter configured to convert the convolved signal to an analog signal.

Example 2 is the test and measurement instrument of example 1, wherein the filter modulation controller is further configured to determine the first time and the second time by identifying a bit prior to a transition in the interpolated samples.

Example 3 is the test and measurement instrument of either one of examples 1 and 2, wherein the first filter coefficients and the second filter coefficients vary in group delay.

Example 4 is the test and measurement instrument of example 3, wherein the filter modulation controller is configured to determine the first time and the second time such that the group delay as a function of time is a sine wave, ramp, or triangle.

Example 5 is the test and measurement instrument of any one of examples 1-4, wherein the digital-to-analog converter is configured to convert the convolved signal to an analog signal based on a fixed, constant clock signal.

Example 6 is the test and measurement instrument of any one of examples 1-5, further comprising a filter generator, the filter generator configured to generate the first filter coefficients and the second filter coefficients.

Example 7 is the test and measurement instrument of example 6, wherein the filter modulation controller includes the filter generator.

Example 8 is the test and measurement instrument of either example 6 or 7, further comprising a user input, wherein the filter generator is configured to generate the first filter coefficients and the second filter coefficients based on the user input.

Example 9 is the test and measurement instrument of any one of examples 6-8, wherein the filter generator is configured to generate the first filter coefficients and the second filter coefficients based on a filter length, a sample rate of the digital-to-analog converter, and an array length.

Example 10 is the test and measurement instrument of any one of example 6-9, wherein the filter generator is further configured to generate the first filter coefficients and the second filter coefficients in real-time.

Example 11 is the test and measurement instrument of any one of examples 1-10, further comprising a memory configured to store a look-up table including the first filter coefficients and the second filter coefficients.

Example 12 is the test and measurement instrument of any one of examples 1-11, further comprising one or more filters configured to filter the convolved signal prior to converting the convolved signal to an analog signal.

Example 13 is a method for introducing jitter to a generated analog waveform in a test and measurement instrument, comprising receiving a digital signal; generating interpolated samples of the digital signal at a sample rate; selecting a first set of filter coefficients at a first time and selecting a second set of filter coefficients at a second time; generating a convolved signal by convolving the interpolated samples of the digital signal and the first filter coefficients and convolving the interpolated samples of the digital signal and the second filter coefficients; and converting the convolved signal to an analog signal.

Example 14 is the method of example 13, further comprising determining the first time and the second time by identifying a bit prior to a transition in the interpolated samples.

Example 15 is the method of either one of examples 13 or 14, wherein the first filter coefficients and the second filter coefficients vary in group delay.

Example 16 is the method of any one of examples 13-15, generating the first filter coefficients and the second filter coefficients based on a filter length, a sample rate of the digital-to-analog converter, and an array length.

Example 17 is the method of example 16, further comprising receiving through a user input at least one of the filter length, a maximum delay, and a minimum delay to generate the first filter coefficients and the second filter coefficients.

Example 18 is the method of either one of examples 16 or 17, wherein the first filter coefficients and the second filter coefficients are generated in real-time.

Example 19 is the method of any one of examples 13-18, further comprising filtering the convolved signal prior to converting the convolved signal to an analog signal.

Example 20 is the method of any one of examples 13-19, further comprising storing a look-up table including the first filter coefficients and the second filter coefficients.

The previously described versions of the disclosed subject matter have many advantages that were either described or would be apparent to a person of ordinary skill. Even so, these advantages or features are not required in all versions of the disclosed apparatus, systems, or methods.

Additionally, this written description makes reference to particular features. It is to be understood that the disclosure in this specification includes all possible combinations of those particular features. Where a particular feature is disclosed in the context of a particular aspect or example, that feature can also be used, to the extent possible, in the context of other aspects and examples.

Also, when reference is made in this application to a method having two or more defined steps or operations, the defined steps or operations can be carried out in any order or simultaneously, unless the context excludes those possibilities.

Although specific examples of the invention have been illustrated and described for purposes of illustration, it will be understood that various modifications may be made without departing from the spirit and scope of the invention. Accordingly, the invention should not be limited except as by the appended claims.

I claim:

1. A test and measurement instrument for generating an analog waveform, comprising:
   an interpolator configured to receive a digital signal and output interpolated samples of the digital signal at a sample rate;
   a filter modulation controller configured to output first filter coefficients at a first time and second filter coefficients at a second time;
   a convolver configured to generate a convolved signal by convolving the interpolated samples of the digital signal and the first filter coefficients and convolving the interpolated samples of the digital signal and the second filter coefficients; and
   a digital-to-analog converter configured to convert the convolved signal to an analog signal.

2. The test and measurement instrument of claim 1, wherein the filter modulation controller is further configured to determine the first time and the second time by identifying a bit prior to a transition in the interpolated samples.

3. The test and measurement instrument of claim 1, wherein the first filter coefficients and the second filter coefficients vary in group delay.

4. The test and measurement instrument of claim 3, wherein the filter modulation controller is configured to determine the first time and the second time such that the group delay as a function of time is a sine wave, ramp, or triangle.

5. The test and measurement instrument of claim 1, wherein the digital-to-analog converter is configured to convert the convolved signal to an analog signal based on a fixed, constant clock signal.

6. The test and measurement instrument of claim 1, further comprising a filter generator, the filter generator configured to generate the first filter coefficients and the second filter coefficients.

7. The test and measurement instrument of claim 6, wherein the filter modulation controller includes the filter generator.

8. The test and measurement instrument of claim 6, further comprising a user input, wherein the filter generator is configured to generate the first filter coefficients and the second filter coefficients based on the user input.

9. The test and measurement instrument of claim 6, wherein the filter generator is configured to generate the first filter coefficients and the second filter coefficients based on a filter length, a sample rate of the digital-to-analog converter, and an array length.

10. The test and measurement instrument of claim 6, wherein the filter generator is further configured to generate the first filter coefficients and the second filter coefficients in real-time.

11. The test and measurement instrument of claim 1, further comprising a memory configured to store a look-up table including the first filter coefficients and the second filter coefficients.

12. The test and measurement instrument of claim 1, further comprising one or more filters configured to filter the convolved signal prior to converting the convolved signal to an analog signal.

13. A method for introducing jitter to a generated analog waveform in a test and measurement instrument, comprising:
   receiving a digital signal;
   generating interpolated samples of the digital signal at a sample rate;
   selecting a first set of filter coefficients at a first time and selecting a second set of filter coefficients at a second time;
   generating a convolved signal by convolving the interpolated samples of the digital signal and the first filter coefficients and convolving the interpolated samples of the digital signal and the second filter coefficients; and
   converting the convolved signal to an analog signal.

14. The method of claim 13, further comprising determining the first time and the second time by identifying a bit prior to a transition in the interpolated samples.

15. The method of claim 13, wherein the first filter coefficients and the second filter coefficients vary in group delay.

16. The method of claim 13, generating the first filter coefficients and the second filter coefficients based on a filter length, a sample rate of the digital-to-analog converter, and an array length.

17. The method of claim 16, further comprising receiving through a user input at least one of the filter length, a maximum delay, and a minimum delay to generate the first filter coefficients and the second filter coefficients.

18. The method of claim 16, wherein the first filter coefficients and the second filter coefficients are generated in real-time.

19. The method of claim 13, further comprising filtering the convolved signal prior to converting the convolved signal to an analog signal.

20. The method of claim 13, further comprising storing a look-up table including the first filter coefficients and the second filter coefficients.

* * * * *